US 6,611,472 B2

(12) United States Patent
Kitamoto et al.

(10) Patent No.: US 6,611,472 B2
(45) Date of Patent: Aug. 26, 2003

(54) MEMORY CIRCUIT FOR PREVENTING RISE OF CELL ARRAY POWER SOURCE

(75) Inventors: Ayako Kitamoto, Kawasaki (JP); Kaoru Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/776,909

(22) Filed: Feb. 6, 2001

(65) Prior Publication Data

US 2001/0014045 A1 Aug. 16, 2001

(30) Foreign Application Priority Data

Feb. 16, 2000 (JP) ..................................... 2000-038874

(51) Int. Cl.$^7$ ................................................ G11C 7/00
(52) U.S. Cl. ....................... 365/227; 365/222; 365/226
(58) Field of Search ............................... 365/226, 222, 365/227, 228, 229, 203

(56) References Cited

U.S. PATENT DOCUMENTS 5,365,487 A * 11/1994 Patel et al. ................. 365/226
6,134,168 A * 10/2000 Harrington et al. ......... 365/222
6,195,306 B1 * 2/2001 Horiguchi et al. .......... 365/226

* cited by examiner

Primary Examiner—Hoai Ho
Assistant Examiner—Gene N. Auduong
(74) Attorney, Agent, or Firm—Arent Fox Kintner Plotkin & Kahn PLLC

(57) ABSTRACT

The present invention is that, in a memory circuit comprising a cell array and peripheral circuit, the cell array power source is supplied to a circuit which operates during the power-down mode in addition to the cell array. The circuit which operates during the power-down mode is, for example, a self-refresh circuit. A dynamic memory requires refreshing operations in fixed intervals even during the power-down mode. Therefore, the self-refresh circuit is operating even during the power-down mode. Thus, by supplying the cell array power source to the self-refresh circuit, it is possible to consume a prescribed quantity of current from the cell array power source generation circuit to an extent of being able to maintain the level thereof even during the power-down mode. The cell array power source may be maintained within an appropriate voltage range thereby.

7 Claims, 9 Drawing Sheets

FIG. 5
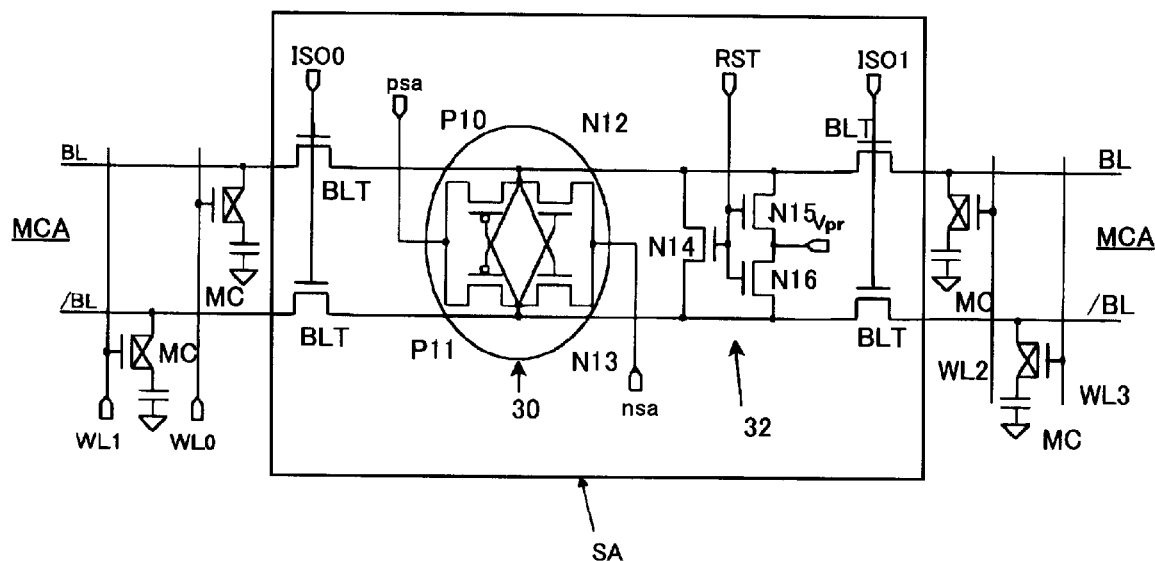
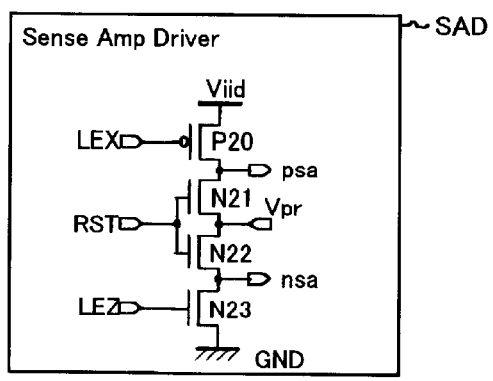

MEMORY CIRCUIT FOR PREVENTING RISE OF CELL ARRAY POWER SOURCE

BACKGROUND OF THE INVENTION

1. Field of the Invention

The present invention generally relates to a memory circuit having a normal operation mode and a power-down mode, and particularly to a memory circuit for preventing the unnecessary rise of the power source potential supplied to the memory cell array during the power-down mode.

2. Description of the Related Art

A dynamic RAM generates a stable internal power source based on an external power source supplied externally, and drives the internal circuits with this internal power source. Further, in order to keep power consumption constant during the normal operation mode, the dynamic RAM generates a lower level power source for cell array which is stepped down from the external power source, and supplies this to the memory cell array occupying a large portion within the chip. This lower level cell array power source is specifically used as the power source of the sense amplifier for driving the bit line, and the voltage of the bit line amplified up to the cell array power source becomes the H level voltage accumulated in the memory cell.

FIG. 1 is an overall schematic diagram of a conventional dynamic RAM. The memory circuit depicted in FIG. 1 comprises a cell array 1 having a plurality of memory cells, a peripheral circuit 2 thereof, a cell array power source generation circuit 3 for generating a cell array power source V1 from an external power source Vcc, an internal power source generation circuit 4 for generating an internal power source Vii from an external power source, and a boosted power source generation circuit 5 for generating a boosted power source Vpp from an external power source Vcc. Circuits within the chip are basically driven with the internal power source Vii. Nevertheless, the cell array power source V1 for driving the sense amplifier and the boosted power source Vpp for driving the word line are additionally supplied to the cell array 1 as a special internal power source.

The cell array power source generation circuit 3 comprises at the final stage an N channel transistor N8, having a gate to which a constant voltage Vg1 is supplied, a drain connected to an external power source Vcc, and a source for outputting the cell array power source V1. This cell array power source V1 is supplied to the cell array 1, and supplies current to the sense amplifier circuit which operates in accordance with the reading, writing, and refreshing at the cell array. The transistor N8 is designed to be of a size sufficient for supplying such current.

Meanwhile, the dynamic RAM has a normal operation mode for conducting such operations of reading, writing and refreshing, and a power-down mode for conserving power consumption by stopping a large portion of the internal circuits at which the aforementioned operations are not conducted. In this power-down mode, the reading and writing operations during the normal operation mode are not conducted. Therefore, there is no driving of a sense amplifier accompanying these operations and hardly any current flows to the transistor N8 at the final stage of the cell array power source generation circuit 3. More precisely, although the self-refresh operation for activating the cell array is conducted in fixed intervals, as these intervals are of long cycles, the period in which the current hardly flows to the transistor N8 is sufficiently longer.

FIG. 2 is a diagram illustrating an example of the properties of the current and voltage of the cell array power source generation circuit. The horizontal axis is the source current I of the final stage transistor N8, and the vertical axis is the voltage of the cell array power source V1. As clear from this diagram regarding properties, when the current I is approximately 1 mA, for example, the cell array power source V1 is within the range of a desired voltage (1.5±0.1 V). This voltage is of a level in which the approximate threshold value voltage of the transistor N8 is subtracted from the gate voltage Vg1. Nevertheless, when the source current I decreases, the cell array power source V1 rises as electric charge is accumulated in the load capacity relating to the cell array power source V1. In the example of FIG. 2, when the source current I decreases to approximately below 20 $\mu$A, the cell array power source V1 becomes higher than a desired voltage range (1.5±0.1 V for example).

As described above, the source voltage V1 rises when the source current I decreases, and, eventually, the transistor N8 operates in a so-called sub-threshold region as the voltage between the gate-source will become lower than the threshold voltage. Moreover, when the source current becomes 0, the source voltage V1 becomes substantially equivalent to the external power source Vcc.

Therefore, in the aforementioned power-down mode where the power consumption becomes extremely small in the cell array, the source current I decreases and the cell array power source V1 rises to a higher voltage than that during the normal operation mode (1.5±0.1 V). Here, for example a large capacity ($C_1$), including parasitic capacity, is disposed in order to prevent the noise of the cell array power source V1 or to stabilize the potential, accumulated will be a change of $\Delta V \times C_1$, $\Delta V$ is a difference of the potential from the desired voltage range. If this change is not consumed immediately after returning to the normal operation mode from the power-down mode, the cell array voltage V1 remains at a level higher than the normal level and the drive voltage V1 on the H level-side of the sense amplifier will become higher than normal. Thus, the bit line pre-charge level, which is the intermediate voltage between the H level (cell array power source V1) and the L level (ground) of the bit line, becomes higher than desired level. During the reading operation conducted by driving the word line at the following cycle, generating a minute voltage to the bit line pair and detecting the minute voltage with the sense amplifier, the voltage difference between the cell accumulated potential at the H level side having the normal cell array voltage and the aforementioned bit line pre-charge level which is higher than desired level becomes smaller than normal, and problems may arise in which such difference is judged as an erroneous data.

Accordingly, with the conventional example, voltage of the cell array power source V1 would differ during the normal operation mode, where the memory circuit is in an active state, and the power-down mode. This led to the possibility of malfunctions as described above.

SUMMARY OF THE INVENTION

Thus, an object of the present invention is to provide a memory circuit capable of preventing the occurrence of such malfunctions by keeping the voltage of an internal power source, such as a cell array power source, the same level during the normal operation mode and the power-down mode.

One aspect of the present invention for achieving the aforementioned object is that, in a memory circuit comprising a cell array and peripheral circuit, the cell array power source is supplied to a circuit which operates during the power-down mode in addition to the cell array. The circuit which operates during the power-down mode in a preferred embodiment is, for example, a self-refresh circuit. A dynamic memory requires refreshing operations in fixed intervals even during the power-down mode. Therefore, the self-refresh circuit is operating even during the power-down mode. Thus, by supplying the cell array power source to the self-refresh circuit, it is possible to consume a prescribed quantity of current from the cell array power source generation circuit to an extent of being able to maintain the level thereof even during the power-down mode. The cell array power source may be maintained within an appropriate voltage range thereby.

The self-refresh circuit includes an oscillation circuit which is constantly in operation, a frequency division circuit for dividing the output of the oscillation circuit, a timing signal generation circuit for generating a long-cycle self-refresh activation timing signal from such division circuit, and so on. By supplying the cell array power source to any one or a plurality of these circuits, or to a power source of apart of these circuits, it is possible to prevent the rise of the voltage level of the cell array power source.

BRIEF DESCRIPTION OF THE DRAWINGS

FIG. 5 is a diagram showing a sense amplifier circuit and sense amplifier driver circuit of a memory circuit employed in the present embodiment;

DESCRIPTION OF THE PREFERRED EMBODIMENTS

The embodiments of the present invention are now described with reference to the relevant drawings. These embodiments, however, shall in no way limit the technological scope of the present invention.

Figure 1:
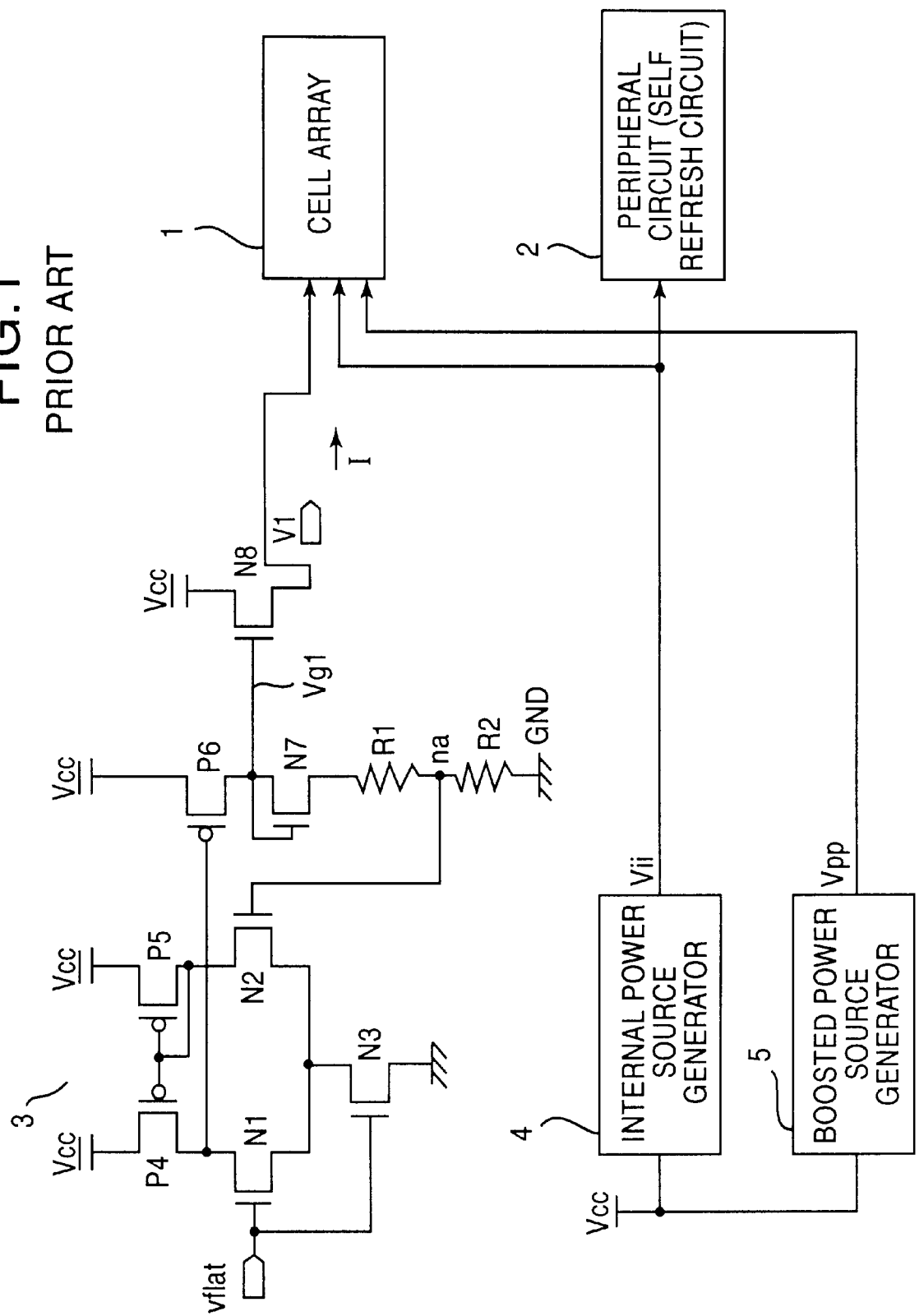
FIG. 1 is an overall schematic diagram of a conventional dynamic RAM.
Figure 3:
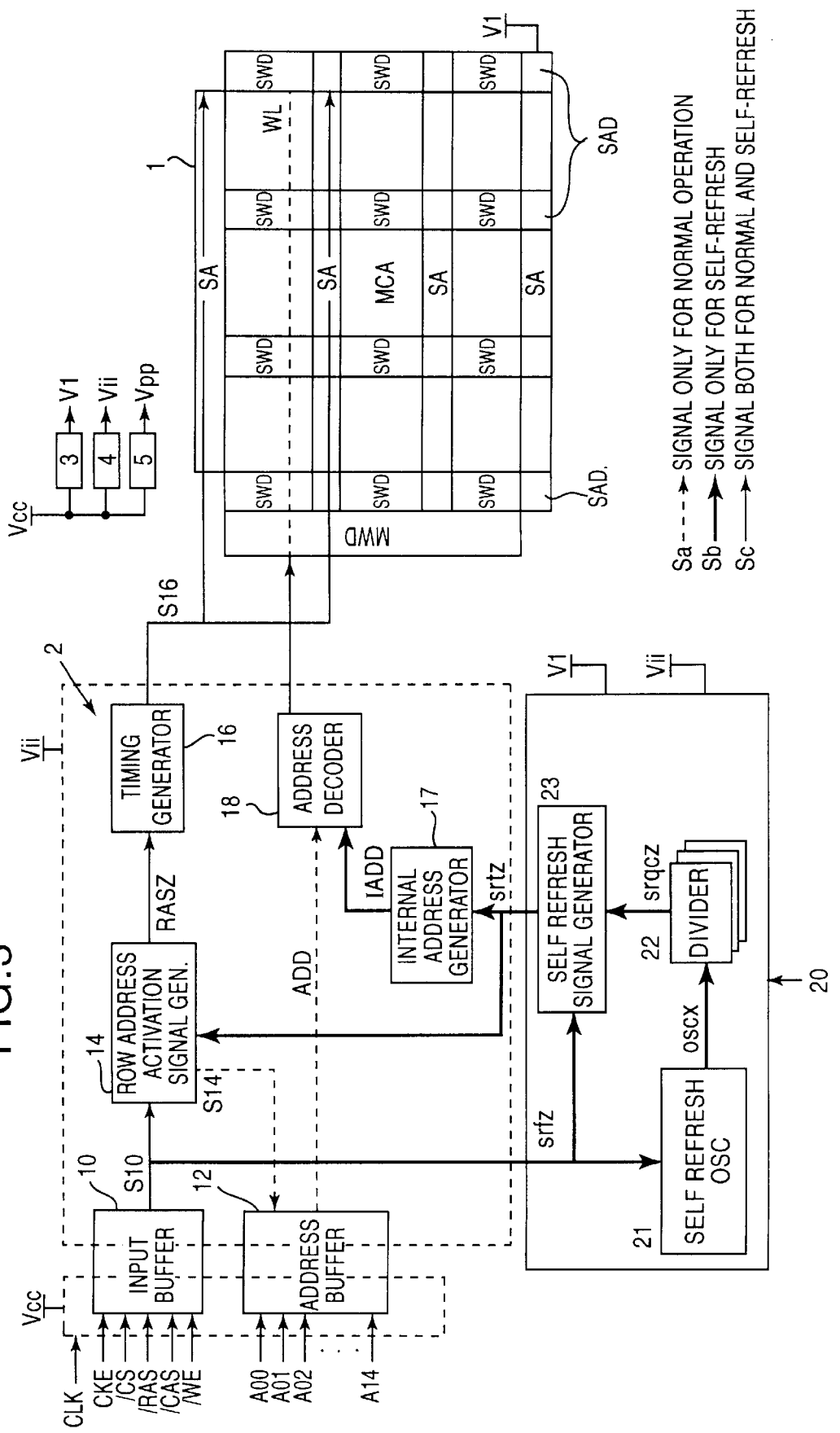
FIG. 3 is a structural diagram of a memory circuit in the present embodiment.

FIG. 3 is a structural diagram of a memory circuit in the present embodiment. The memory circuit shown in FIG. 3 comprises, similar to the conventional example, a cell array 1, a peripheral circuit 2, a cell array power source generation circuit 3, an internal power source generation circuit 4, and a boosted power source generation circuit 5. The self-refresh circuit 20 included within the peripheral circuit 2 shown in FIG. 1 is depicted separately from the peripheral circuit 2 in the example of FIG. 3.

Provided inside the cell array 1 are a memory cell array MCA comprising a word line WL and a bit line and a memory cell positioned at the intersection thereof not shown, a sense amplifier SA for driving the bit line, and a sense amplifier driver SAD for driving the sense amplifier SA. Moreover, although this embodiment shows an example where word lines are layered and driven accordingly, the cell array 1 further comprises a main word decoder MWD for decoding the upper bit of the row address and driving the main word line, and a sub word decoder SWD for decoding the lower bit of the row address in response to the output of MWD and driving the sub word line. The cell array power source V1 is supplied to the sense amplifier driver SAD within the cell array 1.

The peripheral circuit 2 comprises an input buffer 10 for inputting a clock enable signal CKE and command signals /CS, /RAS, /CAS, /WE and decoding the command signals, and an address buffer 12 for inputting addresses A00 through A14 for example. In addition to the internal power source Vii supplied to the peripheral circuit 2, the external power source Vcc is partially supplied to the input buffer 10 and address buffer 12.

The peripheral circuit 2 further comprises a row address activation signal generation circuit 14 for generating a row address activation signal RASZ in response to the output command S10 of the input buffer 10, a timing generation circuit 16 for generating a timing signal S16 in response to the row address activation signal RASZ, an address decoder 18 for decoding the address ADD from the address buffer 12, and an internal address generation circuit 17 for generating an internal address IADD for the self-refresh mode. The internal power source Vii is a power source with a relatively constant voltage generated from the external power source Vcc.

The self-refresh circuit 20 operates in response to the self-refresh enable signal srfz generated in response to the external self-refresh entry command during the power-down mode. The self-refresh circuit 20 comprises a self-refresh oscillator (oscillation circuit) 21, a divider 22 for dividing its output oscx and generating an output signal srqcz having a relatively long self-refresh cycle, and a self-refresh signal generation circuit 23 for generating a self-refresh activation timing signal srtz in the peripheral circuit 2 in response to the output signal srqcz.

In addition to the internal power source Vii, the cell array power source V1 is also supplied to the self-refresh circuit 20, and the cell array power source V1 is supplied to a part of the circuit within the self-refresh circuit 20.

In FIG. 3, the dotted line Sa represents a signal generated only during the normal operation mode, the thick line Sb represents a signal generated only during the self-refresh mode, and the thin line Sc represents a signal generated during both the normal operation mode and the self-refresh mode.

At the beginning of the self-refresh mode, the input buffer 10 detects the self-refresh entry command from the combination of command signals and generates the self-refresh enable signal srfz. In response to this enable signal, a signal srqcz of a relatively long cycle corresponding to the self-refresh cycle is generated by the self-refresh oscillator 21 and divider 22. In response to this signal, the self-refresh signal generation circuit 23 generates a self-refresh activation timing signal srtz and supplies this to the row address activation signal generation circuit 14 and internal address generation circuit 17.

The row address activation signal generation circuit 14 outputs a row address activation signal RASZ, similar to that during the normal operation mode, in response to the self-refresh activation timing signal srtz. In response to this signal RASZ, inside the cell array 1, the word line WL is driven, data of the memory cell is read by the bit line, such data is detected and amplified by the sense amplifier, and rewritten in the memory cell. The internal address IADD generated by the internal address generation circuit 17 is used as the refresh address at such time. Therefore, without being externally supplied with any control signal or address, the memory circuit conducts the self-refresh operation on its own.

Figure 4:
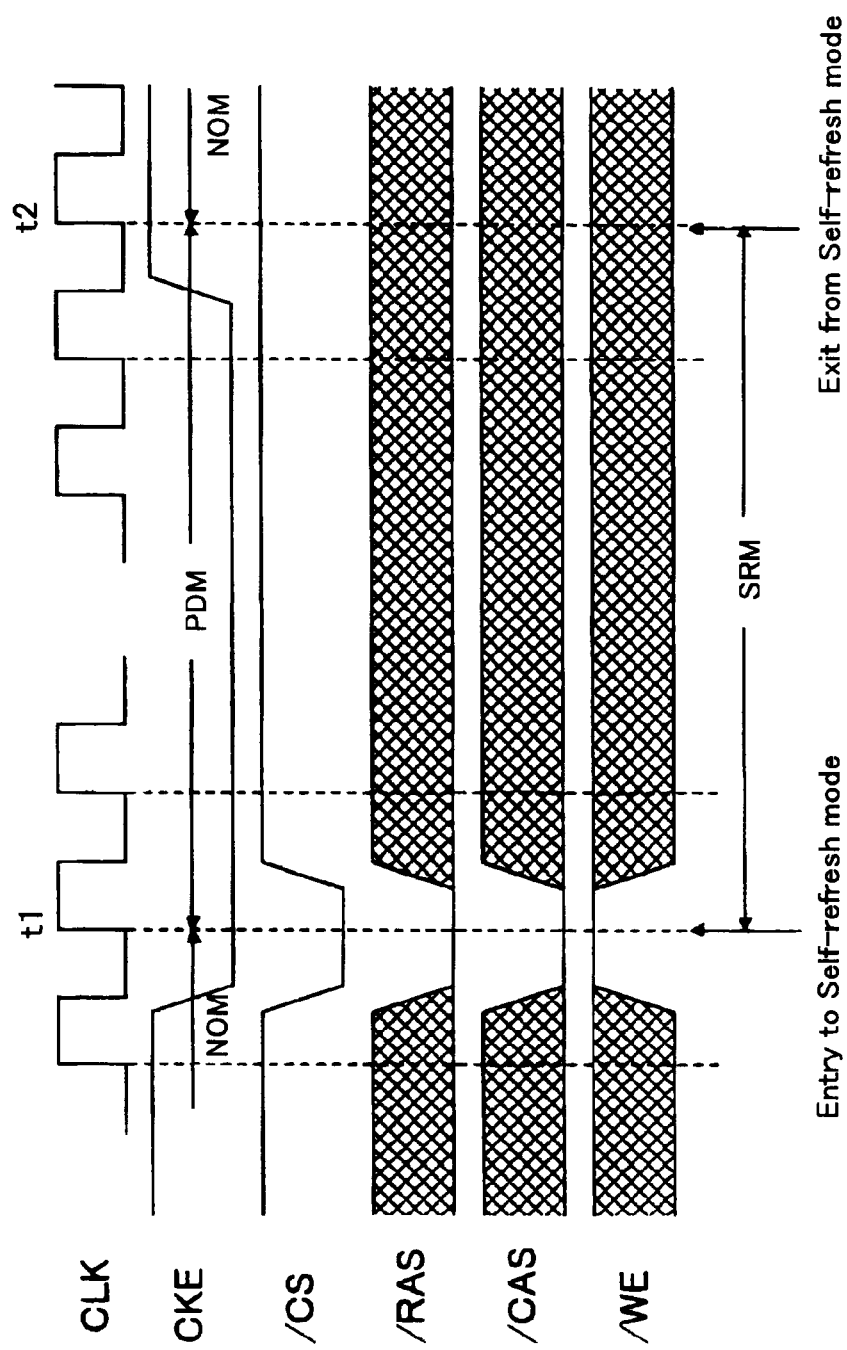
FIG. 4 is a timing chart of the inputted command showing the normal operation mode and power-down mode of a memory circuit in the present embodiment.

FIG. 4 is a timing chart showing the normal operation mode and power-down mode of the memory circuit in the present embodiment. Supplied to the memory circuit are command signals /CS, /RAS, /CAS, /WE in synchronization with the clock CLK. In the normal operation mode NOM, the reading operation, writing operation, refresh operation, etc. are conducted pursuant to the combination of these command signals. The inside of the cell array 1 is in an activated state during the respective operations, and the sense amplifier driver SAD drives the sense amplifier SA so as to consume current from the cell array power source V1.

As shown in FIG. 4, if a clock enable signal CKE of the L level is input in synchronization with the rising edge of the clock CLK of time t1, for example, the memory circuit enters the power-down mode PDM. As it is necessary to refresh the memory cell in prescribed long cycles in the power-down mode, if the combination of command signals /CS=L, /RAS=L, /CAS=L, /WE=H is supplied in a timing of the transition time t1 in which CKE=H→L, for example, the self-refresh entry command by the input buffer 10 is detected. In response thereto, the input buffer 10 generates a self-refresh enable signal srfz, and the memory circuit enters the self-refresh mode SRM.

Then, when the clock enable signal CKE returns to the H level at time t2, the memory circuit is released from the self-refresh mode SRM. Simultaneously, the power-down mode PDM is returned to the normal operation mode NOM. As described above, the power-down mode is determined with only the CKE and the self-refresh mode is therefore an operation mode included in the power-down mode. Nevertheless, the example illustrated in FIG. 4 shows a case where the power-down mode and self-refresh mode are in the same period.

Figure 6:
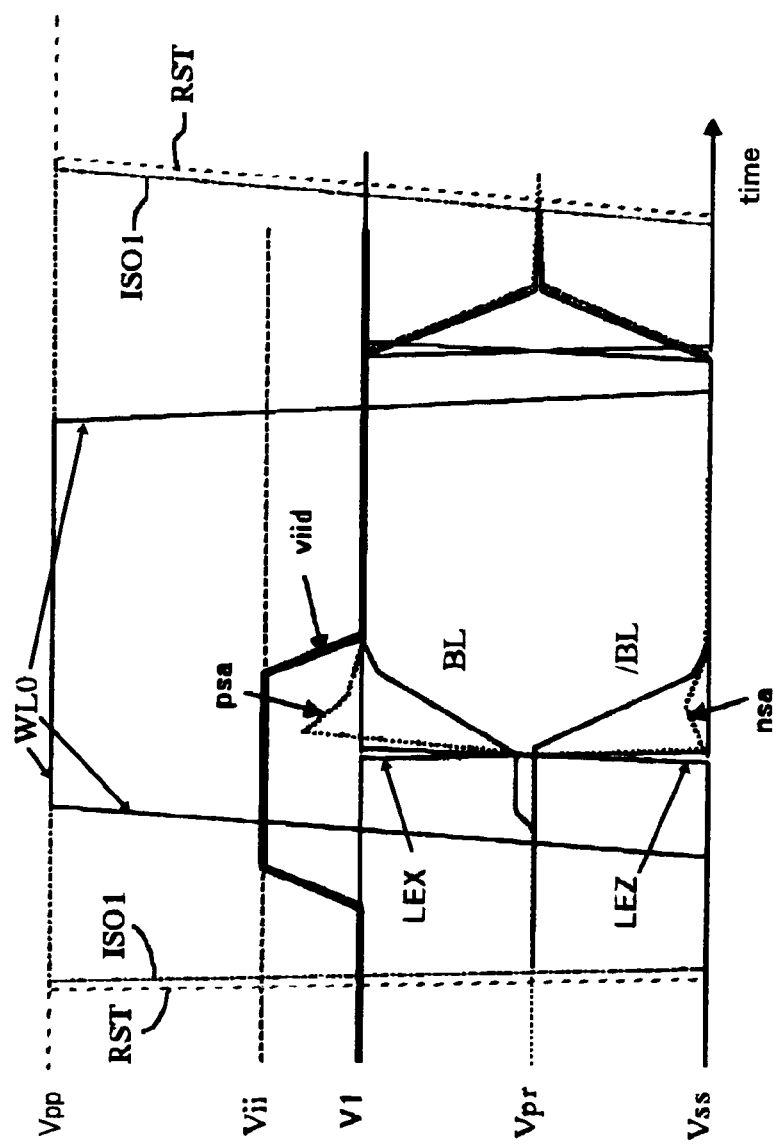
FIG. 6 is a waveform diagram showing the operation depicted in FIG. 5.

FIG. 5 is a diagram showing the main part of the sense amplifier circuit and sense amplifier driver circuit of the memory circuit employed in the present embodiment. Moreover, FIG. 6 is a waveform diagram showing the operation thereof.

Shown in FIG. 5 are a sense amplifier circuit SA, a memory cell array MCA disposed on both sides thereof, and a sense amplifier driver SAD for driving the sense amplifier circuit SA. The memory cell array MCA comprises a pair of bit lines BL and /BL, word lines WL0 through WL3, and memory cells MC formed of one transistor and one capacitor positioned at the intersections thereof. The pair of bit lines are connected to the sense amplifier latch circuit 30 and the bit line reset circuit 32 via the bit line transfer gate BLT. The sense amplifier latch circuit 30 comprises P-type transistors P10, P11 and N-type transistors N12, N13. In addition, the bit line reset circuit 32 comprises a short transistor N14 for short circuiting the pair of bit lines, and transistors N15, 16 for supplying a pre-charge voltage Vpr to the pair of bit lines.

The sense amplifier driver circuit SAD comprises a P-type transistor P20 and N-type transistors N21, N22, N23 between the ground power source GND and drive power source Viid. Although the drive power source Viid is normally a cell array power source V1, in a system of conducting an overdrive for a prescribed period at the time of commencing the drive of the sense amplifier latch circuit 30, for example, it becomes an internal power source Vii during such prescribed period. A typical diagram of the waveform at such time is illustrated in FIG. 6.

The operation shown in FIG. 5 is now explained with reference to the waveform depicted in FIG. 6. The reset signal RST is at an H level during the pre-charge period, all the transistors of the bit line reset circuit 32 are turned on, and the pair of bit lines BL and /BL is at a pre-charge level Vpr, an intermediate (V1/2) level between the ground and cell array power source V1. Further, in the sense amplifier driver circuit SAD, the transistors N21, N22 are turned on, and the drive signals psa, nsa to the sense amplifier latch circuit 30 are at the pre-charge level Vpr.

Upon describing this with the reading operation, when an active command is supplied to the memory cell and a row address activation signal RASZ is generated, the reset signal RST lowers to the L level, transistors of the bit line reset circuit 32 are turned off, and the word line WL0 is driven up to the boosted power source Vpp level. In response thereto, transistors of the memory cell MC connected to the word line WL0 are turned on, and minute voltage is generated in the pair of bit lines BL and /BL. Pursuant to the L level of the reset signal RST, the transistors N21, N22 of the sense amplifier driver circuit SAD are turned off.

After the minute voltage is generated in the pair of bit lines, latch enable signals LEX, LEZ become an L level and H level respectively, the transistors P20 and N23 of the sense amplifier driver circuit SAD are turned on, and the sense amplifier drive signals psa, nsa become an H level and L level respectively. Here, as the power source Viid of the sense amplifier driver circuit SAD is temporarily an internal power source Vii higher than the cell array power source V1, the drive signal psa rises toward the internal power source Vii. In response to this sense amplifier drive signal, the sense amplifier latch circuit 30 is activated, and drives the pair of bit lines BL and /BL to the H level and L level respectively. As the sense amplifier drive signal psa is of the voltage Vii higher than the cell array power source V1, the bit line BL is driven to the H level at an accelerated speed. This is the overdrive operation of the sense amplifier. As the overdrive operation is not directly related to the present invention, the power source Viid of the sense amplifier driver circuit SAD may constantly be maintained at the cell array power source V1.

In the timing of the bit line BL rising to the cell array power source V1 level, the power source Viid is switched to the cell array power source V1, the bit line BL on the H level side becomes the level of the cell array power source V1, and such level is stored in the memory cell. Eventually, the word line WL0 is reset to L level, cell transistors are turned off, and the reading operation is completed. And, by the reset signal RST being driven to the H level, the process returns to the pre-charge state.

As clear from the aforementioned reading operation, it is desirable that the cell array power source V1 be maintained at a constant level. The sense amplifierlifier detects the minute voltages of the pair of bit lines, on the premise that the voltage V1 level rewritten in the memory cell and the level Vpr of the pair of bit lines during the pre-charge period are the relationship of Vpr=V1/2. In such a case, upon returning to the normal operation mode, if a pre-charge level Vpr is generated by short circuiting the pair of bit lines one of which is V1, higher than the normal voltage after having driven the pair of bit lines by using the cell array power source V1 that have risen during the power-down mode, the relationship of Vpr>V1/2 will occur between the increased level Vpr and the level V1 of the bit line drive signal psa at the next cycle, and there is a possibility that a malfunction may occur in the sense operation of the bit line on the H level side.

Therefore, the cell array power source V1 must be maintained in the same voltage range during both the power-down mode and the normal operation mode.

The cell array power source generation circuit is the same as the circuit shown in the conventional example depicted in FIG. 1. Explaining the cell array power source generation circuit with reference to FIG. 1, a constant voltage Vg1 is supplied to the gate of the output transistor N8. This constant voltage Vg1 is generated by circuits formed of transistors N1 through N3, P4 through P6, N7 and resistors R1, R2. This circuit is structured of an differential amplifier circuit formed of transistors N1 through N3, P4, P5 and circuits (P6, N7, R1, R2) for providing feedback of the drain terminal of the transistor N1 of this differential amplifier circuit to the gate of the transistor N2, which is one of the inputs.

A constant voltage Vflat generated by a reference voltage generation circuit not shown is supplied to the gate of the transistor N1, which is the other input of the differential amplifier circuit. The drain terminal of the transistor N1 is supplied to the gate of the transistor P6 of the feedback circuit. The diode connected transistor N7 and resistors R1, R2 are provided between the drain of the transistor P6 and ground GND. When the drain terminal of the transistor N1 rises, the ON resistance of the transistor P6 increases, the level of node na lowers, and the feedback operates so as to lower the ON resistance of the transistor N1. The level of the drain terminal of the transistor N1 takes a downturn due to the lowered ON resistance of N1. Pursuant to this feedback, the level of the node na is maintained substantially at the same level as the level of the constant voltage Vflat. In other words, the gate voltage Vg1 is maintained at a level of voltage with (R1+R2)/R2 times the node na (=Vflat) plus the threshold voltage of transistor N7.

Figure 2:
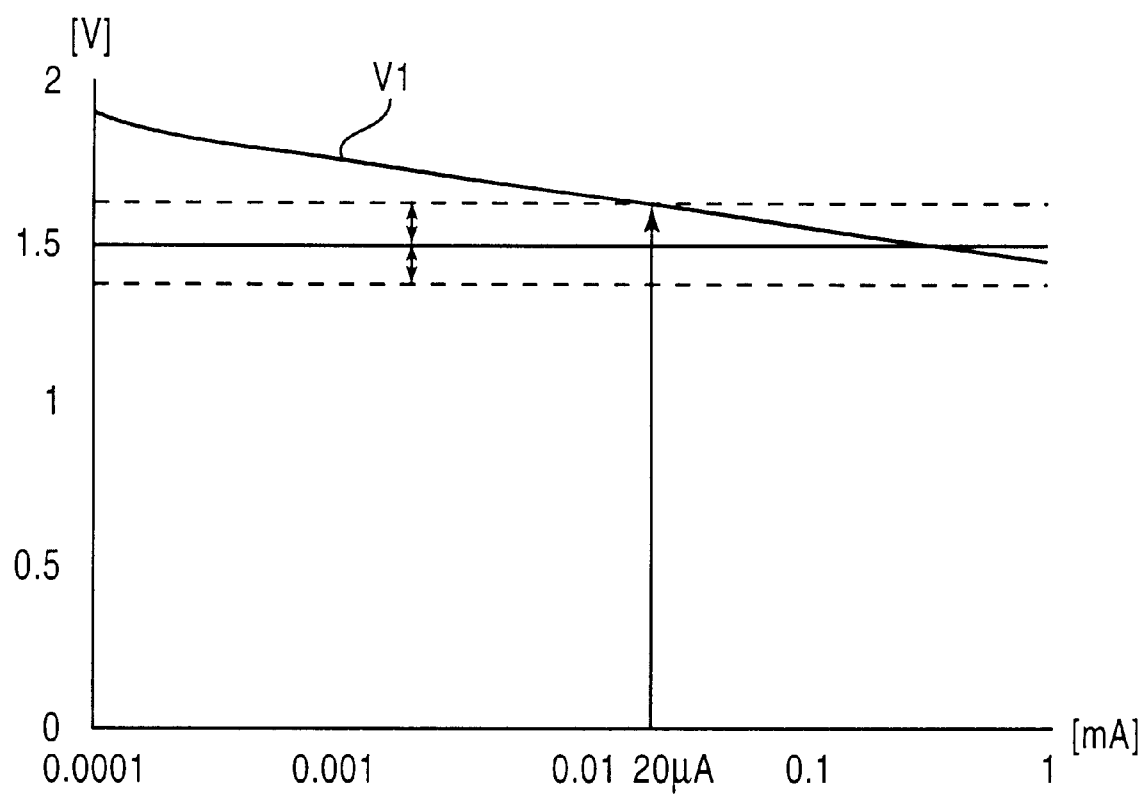
FIG. 2 is a graph showing examples of properties of the current and voltage of a cell array power source generation circuit.

The cell array power source V1 is maintained at a voltage of this constant gate voltage Vg1 minus the threshold value of the final stage transistor N8. As shown in FIG. 2, when the source current I of the transistor N8 is within a certain range, the voltage of the cell array power source V1 is maintained within a constant range.

In the present embodiment, the cell array power source V1 is connected to a circuit which operates during the power-down mode such that the cell array power source V1 is maintained within a constant range even during the power-down mode. Thereby, even during the power-down mode, the source current I of the final stage transistor N8 is maintained within a minimum current range, and excess rise of the cell array power source V1 is prevented.

More preferably, as shown in FIG. 3, the cell array power source V1 is supplied to a part of the circuit within the self-refresh circuit 20. In the most preferable embodiment, the cell array power source V1 is supplied to the self-refresh oscillator 21 within the self-refresh circuit 20.

Figure 7:
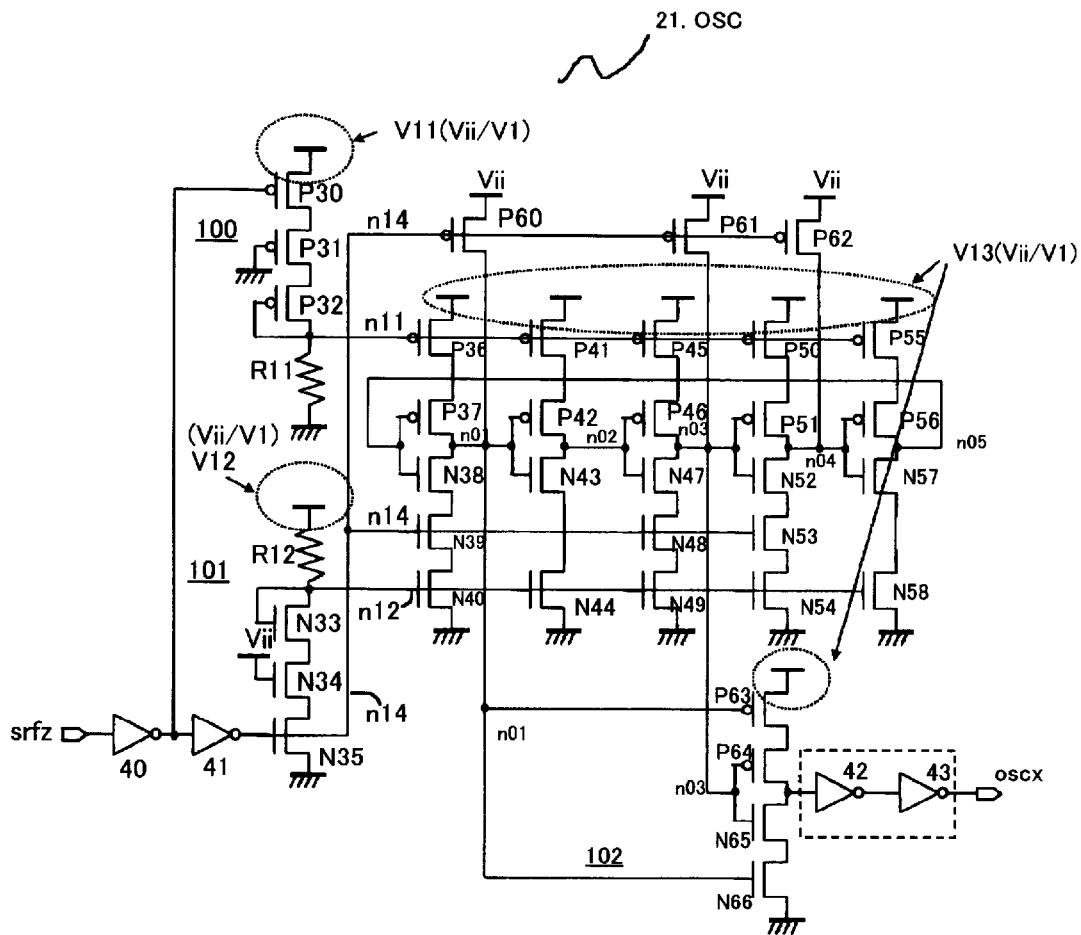
FIG. 7 is a circuit diagram of a self-refresh oscillator 21.
Figure 8:
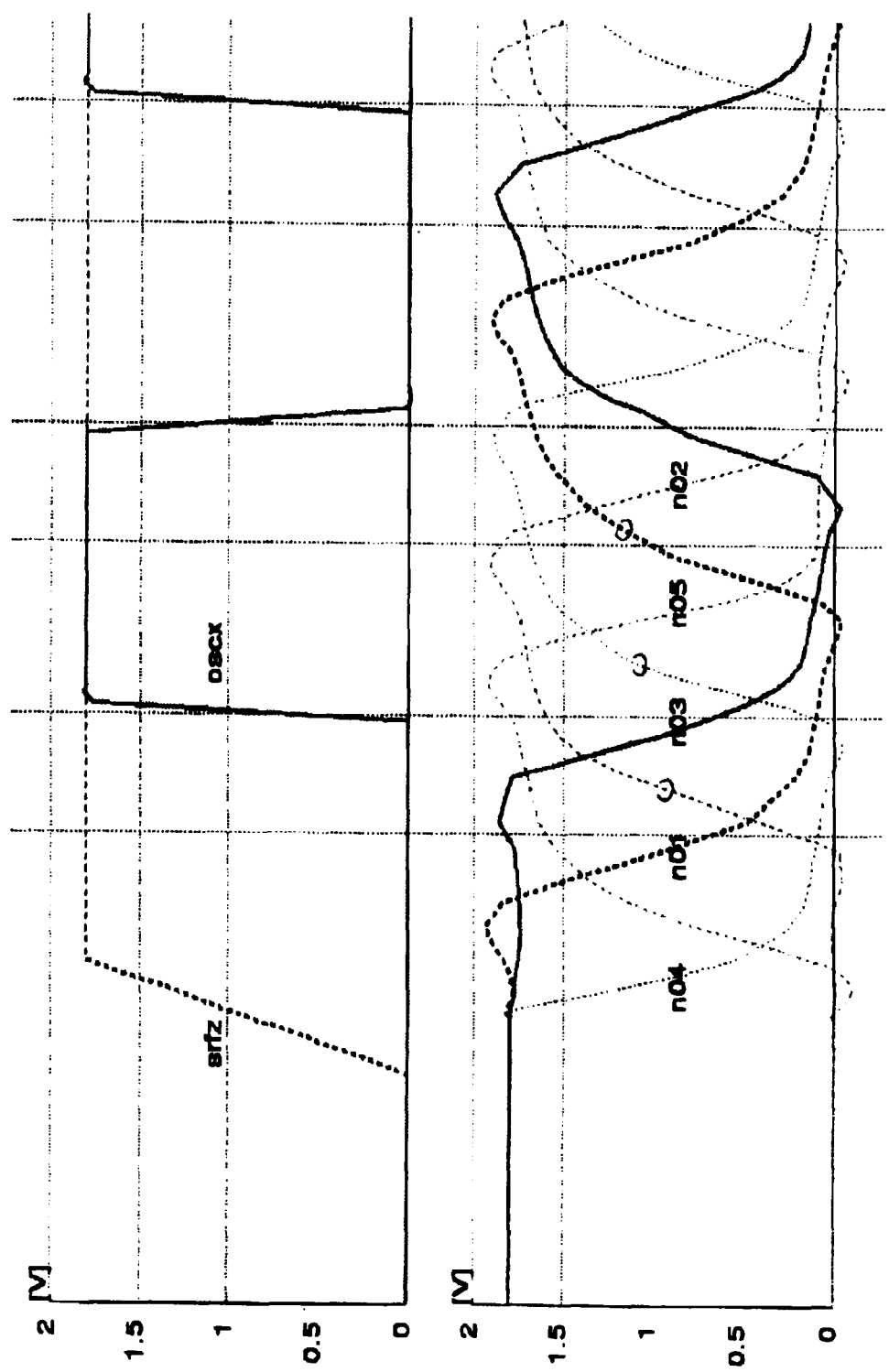
FIG. 8 is an operational waveform diagram of a self-refresh oscillator 21.

FIG. 7 is a circuit diagram of the self-refresh oscillator 21. FIG. 8 is the waveform diagram of the operation thereof. This oscillator 21 has a structure wherein five stages of inverters (transistors P37/N38, P42/N43, P46/N47, P51/N52, P56/N57) are connected in cascade, and the feedback of the output n05 of the final stage inverter (P56/N57) is provided to the first stage inverter (P37/N38). And, pursuant to the output n01 of the first stage inverter and the output n03 of the third stage inverter, the output generation circuit 102 formed of transistors P63, P64, N65, N66 generates a clock oscx in prescribed cycles.

Current-adjustment transistors P36, P41, P45, P50, P55 and N40, N44, N49, N54, N58 are provided to the respective inverters, and the current quantity is controlled in accordance with the level of the voltages n11, n12 supplied to the gates of such tansistors. By increasing this current quantity, the frequency of the oscillator will increase, and by decreasing the current quantity, the frequency will decrease. These voltages n11, n12 are respectively generated by a voltage generation circuit 100 formed of transistors P30, P31, P32 and a resistor R11, and a voltage generation circuit 101 formed of a resistor R12 and transistors N33, N34, N35.

Moreover, provided to the inverters are reset transistors P60, P61, P62, N39, N48, N53. A signal n14 is provided to the gates of these transistors and the respective nodes n01~n05 of the inverters are reset to the initial state (H level, L level).

The operation of the self-refresh oscillator circuit is now explained with reference to FIG. 8. During the normal operation mode, the self-refresh enable signal srfz is at the L level, and the oscillator circuit is in an inactive state. In other words, pursuant to the inverters 40 and 41, the activation signal n14 becomes an L level, the reset transistors P60, P61, P62 are turned on, the reset transistors N39, N48, N53 are turned off, and the nodes n01, n03, n04 are all reset to the H level.

Next, when it changes to the power-down mode and the self-refresh enable signal srfz becomes an H level, the oscillator circuit is activated. That is, the activation signal n14 becomes an H level, P-type reset transistors P60, P61, P62 are turned off, and N-type transistors N39, N48, N53 are turned on. Moreover, the output of the inverter 40 becomes an L level, the transistor P30 of the voltage generation circuit 100 is turned on, and the voltage determined by the transistors P30~P32 and resistor R11 is generated to the node n11. Similarly, output of the inverter 41 becomes an H level, the transistor N35 of the other voltage generation circuit 101 is turned on, and voltage determined by the resistor R12 and transistors N33, N34, N35 is generated to the node n12. These voltage generation circuits 100 and 101 successively flow small quantities of current while the oscillator circuit is in an activated state.

And, as shown in FIG. 8, outputs n01, n02, n03, n04, n05 of the 5-stage inverters are respectively transferred to L, H, L, H, L levels and oscillate. Pursuant to the L level of node n01, the transistor P63 of the output generation circuit 102 is turned on and, in response to the change of the L level of node n03 thereafter, the transistor P64 is also turned on, and the output oscx will become an H level. Similarly, in response to the changes in the H level of node n01 and the H level of node n03, the transistors N66, N65 are turned on, and the output oscx becomes an L level. As the output waveforms of the respective inverters are weakened as shown in FIG. 8, a generation of a pass current (from Vii to GRN) in the output generation circuit 102 can be prevented by controlling such output generation circuit pursuant to the nodes n01 and n03 which are the outputs of the inverters.

By supplying the cell array power source V1 to any one of, in combination, or to all of power sources V11, V12, V13 in the self-refresh oscillator circuit shown in FIG. 7, the level of V1 can be maintained within a constant range. For instance, upon supplying the cell array power source V1 to the power sources V11 and V12 of the voltage generation circuits, it is possible to maintain the cell array voltage V1 at a constant value as the voltage generation circuits 100 and 101 successively flow small quantities of current in a fixed amount while the oscillator circuit is being activated. Otherwise, it is also possible to supply the cell array power source V1 to the power source V13 of the 5-stage inverters and the output generation circuit 102. As these inverters and the output generation circuit 102 are connected in cascade, it is necessary to provide the same power source in order to guarantee a normal operation. These circuits consume current in accordance with the oscillatory operation of the oscillator circuit. Therefore, if the cell array power source V1 is supplied to this power source V13, the cell array power source V1 can be maintained at a constant level as the inverters and the output generation circuit 102 successively consumes current. The application of the cell array voltage V1 to the power source among V11, V12, and V13 may be selected in accordance with the respective cases.

Furthermore, when providing a cell array power source V1 lower than the internal power source Vii to the power source V13, it is necessary to make the inverters 42 and 43 into a level conversion circuit 44 shown at the bottom of FIG. 7, and shift-up the H level of output oscx to the internal power source Vii. The level conversion circuit 44 comprises transistors P67, P68, N69, N70 and generates a signal oscx having an H level of the internal power source Vii in response to the H level input of the cell array power source V1.

Figure 9:
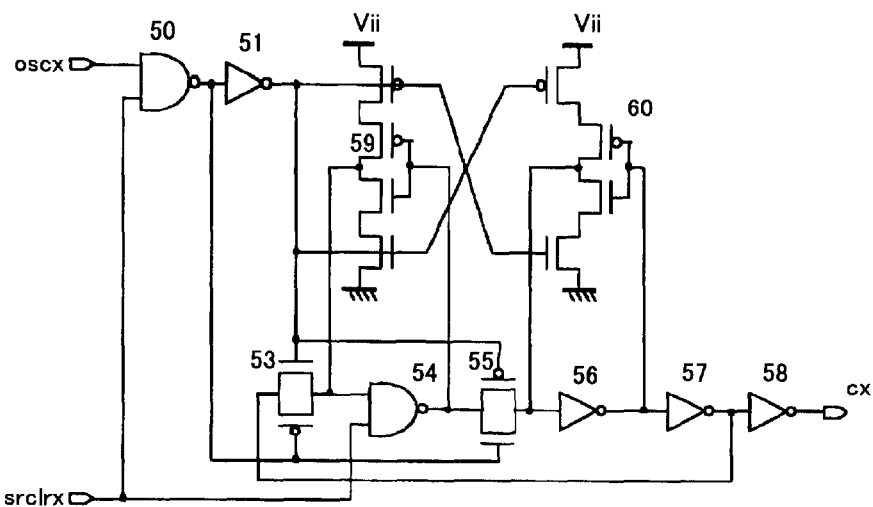
FIG. 9 is a circuit diagram of one unit of a divider.

FIG. 9 is a circuit diagram of one unit of a frequency divider 22 of the self-refresh circuit 20. The units shown in FIG. 9 are connected in a plurality of stages to form the divider 22, which divides the output oscx of the oscillator circuit 21. As the self-refresh cycle is a cycle longer than 10 $\mu$s, for example, a signal srqcz (not shown) with $2^n$ times the output signal oscx of the oscillator circuit is generated by a divider formed of n stages of counters.

The unit circuit shown in FIG. 9 is of a three-stage structure comprising a NAND gate 54, and inverters 56 and 57. A transfer gate 53 is provided between the inverter 54 and NAND gate 54 and a transfer gate 55 is provided between the NAND gate 54 and inverter 56. The opening/closing of these transfer gates 53 and 55 is controlled ON/OFF alternately pursuant to the signals generated by the NAND gate 50 and inverter 51. Then, a latch circuit is structured with the NAND gate 54 and inverter 59, or a separate latch circuit is structured with the inverters 56 and 60. A signal cx divided to be twice the cycle of the input oscx is generated pursuant to this single unit. Although the internal power source Vii is normally used as the power source of this divider, the cell array power source V1 may also be used for the divider.

Figure 10:
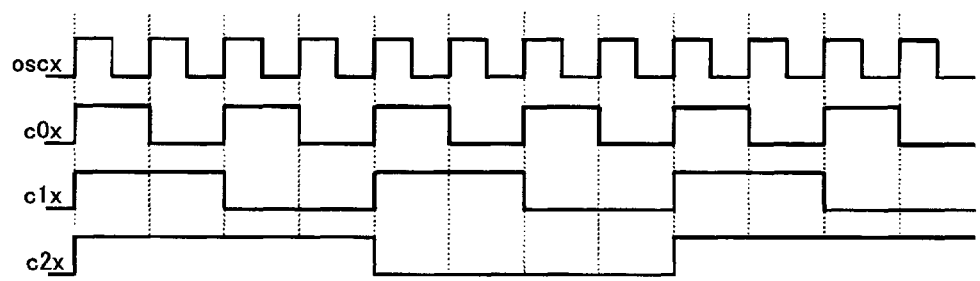
FIG. 10 is an operational timing chart of a divider.

FIG. 10 shows the outputs c0x, c1x, c2x of the respective unit circuits upon structuring the unit circuit shown in FIG. 9 in 3 stages. The cycle of the output c2x is 8 times that of input oscx.

Figure 11:
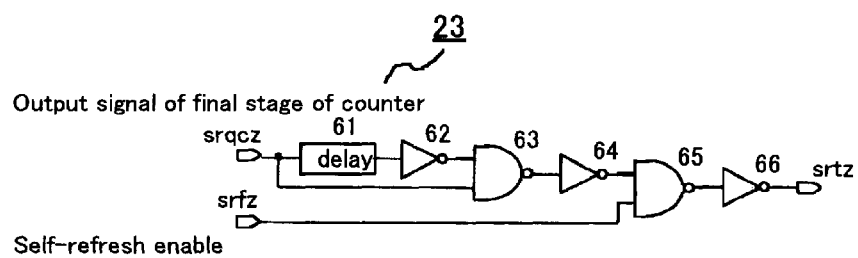
FIG. 11 is a circuit diagram of a self-refresh signal generation circuit 23.

FIG. 11 is a circuit diagram of the self-refresh signal generation circuit 23 which generates a self-refresh activation timing signal srtz based on the last stage output signal srqcz of the divider. The self-refresh signal generation circuit 23 comprises a delay circuit 61, inverters 62, 64, 66, and NAND gates 63, 65. A signal having a pulse width of the delay time of the delay circuit 61 is generated at the output of the NAND gate 63 in response to the rising edge of the divider output signal srqcz. Then, the aforementioned pulse signal is output as the self-refresh activation timing signal srtz from the inverter 66 when the self-refresh enable signal srfz is in the H level. In response to this timing signal srtz, the memory cell of the internal address of the cell array is activated and rewritten.

According to the present invention, as the cell array power source V1 is supplied to a circuit which operates during the power-down mode, an appropriate quantity of current is consumed from the cell array power source V1, and the rise of the cell array power source V1 is thereby prevented. As a result, the normal operation of the cell array is guaranteed.

The scope of protection of the present invention shall not be limited to the aforementioned embodiment, and shall include the invention described in the claims as well as any equivalents thereof.

What is claimed is:

1. A memory circuit having a cell array and peripheral circuit, and having a normal operation mode in which said cell array is accessed from outside and a power-down mode in which said normal operation is not conducted, and further comprising:

a cell array power source generation circuit for generating a cell array power source to be supplied to said cell array;

an internal power source generation circuit for generating an internal power source to be supplied to said peripheral circuit; and a current path for consuming a predetermined current from said cell array power source during said power-down mode, said current path including a first current path to said cell array and a second current path to at least a part of said peripheral circuit.

2. A memory circuit according to claim 1, further comprising a self-refresh circuit which operates during said power-down mode and refreshes a memory cell within said cell array in prescribed cycles, wherein said current path is connected to at least a part of a circuit of said self-refresh circuit.

3. A memory circuit according to claim 2, wherein the part of the circuit of said self-refresh circuit comprises any one among an oscillation circuit which activates during said power-down mode, a frequency division circuit for dividing an output of said oscillation circuit, and a self-refresh signal generation circuit for generating a self-refresh activation timing signal in response to an output of said division circuit.

4. A memory circuit according to claim 1, wherein said cell array includes a plurality of memory cells, bit lines and word lines connected to the memory cell array, and a sense amplifier for driving the bit line, said cell array power source is supplied to said sense amplifier for driving the bit line, a frequency of the driving operation of the sense amplifier is lower in the power-down mode than in the normal operation mode.

5. A memory circuit having a cell array and peripheral circuit, in which said memory circuit has a normal operation mode in which said cell array is accessed from outside and a power-down mode in which said normal operation is not conducted, and further comprising:

a cell array power source generation circuit for generating a cell array power source to be supplied to said cell array;

an internal power source generation circuit for generating an internal power source to be supplied to said peripheral circuit; and a self-refresh circuit which operates during said power-down mode and refreshes a memory cell within said cell array in prescribed intervals;

wherein said cell array power source is supplied to at least a part of a circuit of said self-refresh circuit, in addition to said cell array.

6. A memory circuit according to claim 5, wherein the part of the circuit of said self-refresh circuit includes an oscillation circuit which operates during the power-down mode.

7. A memory circuit according to claim 6, wherein said cell array power source and said internal power source are supplied to said self-refresh circuit.

* * * * *